(12) United States Patent
Chen et al.

(10) Patent No.: US 12,283,233 B2
(45) Date of Patent: Apr. 22, 2025

(54) DISPLAY PANEL

(71) Applicant: ENKRIS SEMICONDUCTOR, INC., Jiangsu (CN)

(72) Inventors: Yuchao Chen, Jiangsu (CN); Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 0 days.

(21) Appl. No.: 18/569,197

(22) PCT Filed: Jun. 18, 2021

(86) PCT No.: PCT/CN2021/101077
§ 371 (c)(1),
(2) Date: Dec. 11, 2023

(87) PCT Pub. No.: WO2022/261981
PCT Pub. Date: Dec. 22, 2022

(65) Prior Publication Data
US 2024/0265853 A1    Aug. 8, 2024

(51) Int. Cl.
*G09G 3/32* (2016.01)
*H10F 71/00* (2025.01)
*H10H 20/825* (2025.01)

(52) U.S. Cl.
CPC ........... *G09G 3/32* (2013.01); *H10F 71/1278* (2025.01); *H10H 20/825* (2025.01)

(58) Field of Classification Search
CPC ....... G09G 3/32; H01L 31/1856; H01L 33/32; H01L 33/00; H01L 27/15
See application file for complete search history.

(56) References Cited

U.S. PATENT DOCUMENTS

| 8,089,074 B2 | 1/2012 | Kim et al. |
| 8,598,598 B2 | 12/2013 | Kim et al. |

(Continued)

FOREIGN PATENT DOCUMENTS

| CN | 101263610 A | 9/2008 |
| CN | 107068811 A | 8/2017 |

(Continued)

OTHER PUBLICATIONS

ISA State Intellectual Property Office of the People's Republic of China, International Search Report Issued in Application No. PCT/CN2021/101077, Mar. 16, 2022, WIPO, 6 pages.

(Continued)

*Primary Examiner* — Brent D Castiaux
(74) *Attorney, Agent, or Firm* — The Small Patent Law Group LLC; Christopher R. Carroll

(57) ABSTRACT

The present disclosure provides a display panel, including: a display region, where the display region includes GaN-based LED units arranged in an array, the display region includes a first-selected region, the first-selected region includes a capturing-visible-light-image state including a state of real-time viewing before capturing and a capturing-image state; at the state of real-time viewing before capturing, some GaN-based LED units in the first-selected region are used for real-time viewing before capturing, and at the capturing-image state, all of the GaN-based LED units in the first-selected region are used for capturing an image.

17 Claims, 4 Drawing Sheets

(56) References Cited

U.S. PATENT DOCUMENTS

| | | | |
|---|---|---|---|
| 10,290,257 | B1 | 5/2019 | Slobodin |
| 10,566,322 | B2 | 2/2020 | Chen |
| 10,644,195 | B2 | 5/2020 | Tian et al. |
| 10,769,990 | B2 | 9/2020 | Cho et al. |
| 11,120,739 | B2 | 9/2021 | Cho et al. |
| 2008/0211400 | A1 | 9/2008 | Kim et al. |
| 2010/0219426 | A1 | 9/2010 | Kim et al. |
| 2014/0008671 | A1 | 1/2014 | Kim et al. |
| 2016/0327737 | A1* | 11/2016 | Zhang .................. H10F 77/413 |
| 2017/0365588 | A1 | 12/2017 | Chen |
| 2018/0198980 | A1* | 7/2018 | Takagi .................. G06V 40/19 |
| 2018/0269352 | A1 | 9/2018 | Tian et al. |
| 2019/0251898 | A1 | 8/2019 | Cho et al. |
| 2019/0386173 | A1 | 12/2019 | Chen et al. |
| 2020/0035146 | A1* | 1/2020 | Pan ....................... H01S 5/0218 |
| 2020/0251522 | A1* | 8/2020 | Then .................... H10D 62/149 |
| 2020/0402453 | A1 | 12/2020 | Cho et al. |
| 2021/0405807 | A1 | 12/2021 | Cho et al. |

FOREIGN PATENT DOCUMENTS

| | | |
|---|---|---|
| CN | 107527930 A | 12/2017 |
| CN | 110165031 A | 8/2019 |
| CN | 110556459 A | 12/2019 |
| CN | 111370461 A | 7/2020 |
| WO | 2020257680 A1 | 12/2020 |

OTHER PUBLICATIONS

ISA State Intellectual Property Office of the People's Republic of China, Written Opinion of the International Searching Authority Issued in Application No. PCT/CN2021/101077, Mar. 16, 2022, WIPO, 5 pages. (Submitted with Machine/Partial Translation).

* cited by examiner

DISPLAY PANEL

CROSS REFERENCE TO RELATED APPLICATIONS

This application is a US National Phase of a PCT Application No. PCT/CN2021/101077 filed on Jun. 18, 2021, the entire contents of which are incorporated herein by reference in their entireties.

TECHNICAL FIELD

The present disclosure relates to the field of semiconductor technology, and in particular to a display panel.

BACKGROUND

With a rapid development of the display technology, users have higher and higher requirements for the screen occupation ratio. In the prior art, since components like cameras, face identification devices, or fingerprint identification devices etc. need to be installed at the screen, some slots are usually provided in the screen to install the above-mentioned components, such as the front-bang-area of the Apple mobile phone (e.g. iPhoneX) which affects the overall consistency of the screen. Full-screen display has attracted more and more attention in the industry.

SUMMARY

The purpose of the present disclosure is to provide a display panel to solve the deficiencies in related technologies.

In order to achieve the above object, the present disclosure provides a display panel, including a display region, wherein the display region includes GaN-based LED units arranged in an array, the display region includes a first-selected region, the first-selected region includes a capturing-visible-light-image state including a state of real-time viewing before capturing and a capturing-image state; at the state of real-time viewing before capturing, some GaN-based LED units in the first-selected region are used for real-time viewing before capturing, and at the capturing-image state, all number of the GaN-based LED units in the first-selected region are used for capturing an image.

Optionally, the display region includes a second-selected region, the second-selected region includes an infrared-identifying state, at the infrared-identifying state, some GaN-based LED units in the second-selected region are used for emitting infrared light, and the remaining GaN-based LED units in the second-selected region are used for sensing infrared light.

Optionally, the display region includes a third-selected region, the third-selected region includes a visible-light-identifying state, at the visible-light-identifying state, some GaN-based LED units are used for illuminating, and the remaining GaN-based LED units are used for sensing visible light.

Optionally, the first-selected region is the display region; or the second-selected region is the display region; or the third-selected region is the display region; or the display region includes the first-selected region and the second-selected region which are staggered with each other completely; or the display region includes the first-selected region and the third-selected region which are staggered with each other completely; or the display region includes the second-selected region and the third-selected region which are staggered with each other completely; or the display region includes the first-selected region, the second-selected region and the third-selected region which are staggered with each other completely.

Optionally, the display region includes a display state, and at the display state, the GaN-based LED units in the display region are used for displaying a visible light image.

Optionally, each of the GaN-based LED units includes GaN-based LED structures, each of the GaN-based LED structures includes a red-light photosensitive and emitting layer, a green-light photosensitive and emitting layer, a blue-light photosensitive and emitting layer and an infrared photosensitive and emitting layer which are stacked from up and down; materials of the red-light photosensitive and emitting layer, the green-light photosensitive and emitting layer, the blue-light photosensitive and emitting layer and the infrared photosensitive and emitting layer are GaN-based materials containing different proportions of In; when the red-light photosensitive and emitting layer, the green-light photosensitive and emitting layer, the blue-light photosensitive and emitting layer and the infrared photosensitive and emitting layer are used for sensing light, photosensitive charges are generated based on wavelengths of received light, or not generated based on wavelengths of received light; and when the red-light photosensitive and emitting layer, the green-light photosensitive and emitting layer, the blue-light photosensitive and emitting layer and the infrared photosensitive and emitting layer are used for emitting light, light with different wavelengths and different strengths is generated based on values of applied voltages.

Optionally, a proportion range of In component in the red-light photosensitive and emitting layer is from 0.4 to 0.6;
  a proportion range of In component in the green-light sensitive and emitting layer is from 0.2 to 0.3;
  a proportion range of In component in the blue-light sensitive and emitting layer is from 0.01 to 0.1; and
  a proportion range of In component in the infrared sensitive and emitting layer is from 0.7 to 0.9.

Optionally, the display panel includes a base having charge storage regions; and each of the GaN-based LED structures is electrically connected to one of the charge storage regions to store generated photosensitive charges.

Optionally, the base is provided with transistors, a source region or a drain region of at least one of the transistors is one of the charge storage regions, a metal interconnect layer is between the base and the GaN-based LED units, and a metal interconnect structure of the metal interconnect layer is electrically connected to the transistors.

Optionally, the transistors are provided with a photosensitive-processing circuit, and the photosensitive-processing circuit detects photosensitive electrical signals generated by the GaN-based LED structures;
  in response to determining that a photosensitive electrical signal intensity detected by the photosensitive-processing circuit from the GaN-based LED structures is greater than a fifth threshold value, a blue-light incident signal is stored;
  in response to determining that a photosensitive electrical signal intensity detected by the photosensitive-processing circuit from the GaN-based LED structures is greater than a sixth threshold value and less than or equal to the fifth threshold value, a green-light incident signal is stored;
  in response to determining that a photosensitive electrical signal intensity detected by the photosensitive-processing circuit from the GaN-based LED structures is greater than a seventh threshold value and less than or equal to the sixth threshold value, a red-light incident signal is stored; and in response to determining that a photosensitive electrical signal intensity detected by the photosensitive-processing circuit from the GaN-based LED structures is less than or equal to a seventh threshold value, an infrared-light incident signal is stored.

Optionally, the metal interconnect layer has a conductive plug, a first end of the conductive plug is connected to one of the GaN-based LED structures, and a second end of the conductive plug is electrically connected to one of the charge storage regions.

Optionally, the transistors are further provided with an infrared-emitting circuit, an input end of the infrared-emitting circuit is used to receive infrared-emitting signals, an output end of the infrared-emitting circuit is connected to the metal interconnect structures, and the infrared-emitting signals are transmitted to the GaN-based LED structures through the metal interconnect structures.

Optionally, the transistors are further provided with a display-drive circuit, an input end of the display-drive circuit is used to receive a red display driving signal, a green display driving signal and a blue display driving signal, an output end of the display-drive circuit is connected to the metal interconnect structures, and the red display driving signal, the green display driving signal and the blue display driving signal are transmitted to the GaN-based LED structures through the metal interconnect structures.

Optionally, one of the display-drive circuit and the photosensitive-processing circuit is connected to the metal interconnect structures at the same time, one of the photosensitive-processing circuit and the infrared-emitting circuit is connected to the metal interconnect structures at the same time.

Figure 1:
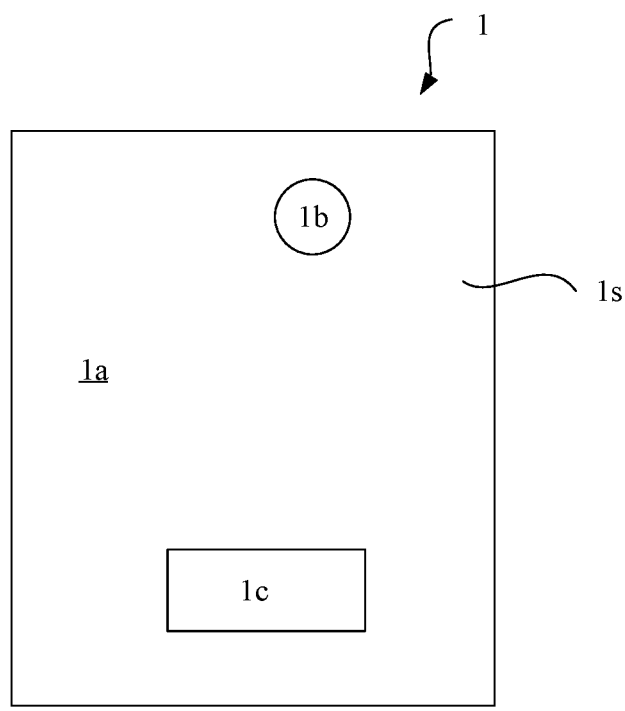
FIG. 1 is a top view of a display panel according to a first embodiment of the present disclosure.

For the convenience of understanding the present disclosure, all reference numerals appearing in the present disclosure are listed below.

Display panel 1, 2, 3, 4, 5, 6, 7
Display region 1s
First-selected region 1a
Second-selected region 1b
Third-selected region 1c
Base 10
GaN-based LED unit 11
GaN-based LED structure 111
Red-light photosensitive and emitting layer 111a
Green-light photosensitive and emitting layer 111b
Blue-light photosensitive and emitting layer 111c
Infrared photosensitive and emitting layer 111d
Light-shielding structure 112
Charge storage region 101
Transistor 102
Metal interconnect layer 14
Metal interconnect structure 141
Conductive plug 142
Photosensitive-processing circuit 13
Infrared-emitting circuit 15
Display-drive circuit 16
Lens structure 12

DETAILED DESCRIPTION

In order to make the above-mentioned objects, features and advantages of the present disclosure more obvious and understandable, embodiments of the present disclosure will be described in detail below with reference to the accompanying drawings.

Figure 2:
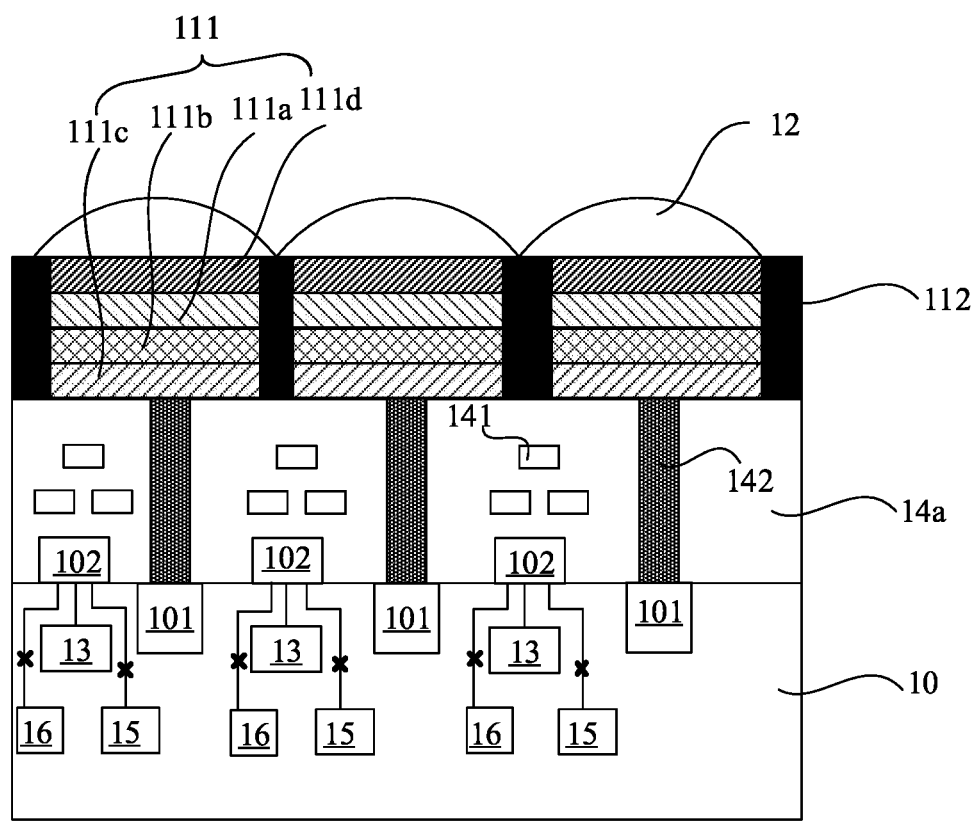
FIG. 2 is a schematic cross-sectional structural diagram of the display panel in FIG. 1.

FIG. 1 is a top view of a display panel according to a first embodiment of the present disclosure. FIG. 2 is a schematic cross-sectional structural diagram of the display panel in the FIG. 1.

Referring to FIGS. 1 and 2, a display panel 1 includes a display region 1s, the display region is includes GaN-based LED (light-emitting diode) units 11 which are arranged in an array. The display region is includes a first-selected region 1a, a second-selected region 1b and a third-selected region 1c.

The first-selected region 1a includes a capturing-visible-light-image state, the capturing-visible-light-image state includes a state of real-time viewing before capturing and a capturing-image state, at the state of real-time viewing before capturing, some GaN-based LED units 11 of the first-selected region 1a are used for real-time viewing before capturing, and in the capturing-image state, all GaN-based LED units 11 in the first-selected region 1a are used for image capturing.

The second-selected region 1b includes an infrared-identifying state. In the infrared-identifying state, some GaN-based LED units 11 of the second-selected region 1b are used to emit the infrared-light, and the remaining GaN-based LED units 11 of the second-selected region 1b are used to sense the infrared light.

The third-selected region 1c includes a visible-light-identifying state. In the visible-light-identifying state, some GaN-based LED units 11 are used for illumination, and the remaining GaN-based LED units 11 are used to sense the visible-light.

Referring to FIG. 2, each GaN-based LED unit 11 includes GaN-based LED structures 111, each GaN-based LED structure 111 may include a red-light photosensitive and emitting layer 111a, a green-light photosensitive and emitting layer 111b, a blue-light photosensitive and emitting layer 111c and an infrared photosensitive and emitting layer 111d, which are stacked up and down. The materials of the red-light photosensitive and emitting layer 111a, the green-light photosensitive and emitting layer 111b, the blue-light photosensitive and emitting layer 111c and the infrared photosensitive and emitting layer 111d are all GaN-based materials containing different proportion of In. When the red-light photosensitive and emitting layer 111a, the green-light photosensitive and emitting layer 111b, the blue-light photosensitive and emitting layer 111c and the infrared photosensitive and emitting layer 111d are used for sensing light, photosensitive charges are generated based on the wavelengths of the received light or not generated based on the wavelengths of the received light. When the red-light photosensitive and emitting layer 111a, the green-light photosensitive and emitting layer 111b, the blue-light photosensitive and emitting layer 111c and the infrared photosensitive and emitting layer 111d are used for emitting light, light with different wavelengths and brightness is generated based on different values of applied voltages.

The GaN-based LED structure 111 can be disposed on a base 10. The substrate 10 may be a single crystal silicon substrate.

In this embodiment, in a direction away from the base 10, each GaN-based LED structure 111 includes: the blue-light photosensitive and emitting layer 111c, the green-light photosensitive and emitting layer 111b, the red-light photosensitive and emitting layer 111a and the infrared photosensitive and emitting layer 111d in turn. One of the benefits of the above arrangement is that at the photosensitive state, a quick attenuation of the infrared-light and the red-light can be prevented when the infrared-light and the red-light are passing through each photosensitive and emitting layer.

A light-shielding structure 112 may be disposed between adjacent GaN-based LED structures 111. Before epitaxially growing the blue-light photosensitive and emitting layer 111c, the green-light photosensitive and emitting layer 111b, the red-light photosensitive and emitting layer 111a and the infrared photosensitive and emitting layer 111d on the base 10, multiple light-shielding structures 112 are formed on the base 10.

The material of the light-shielding structure 112 may be metal molybdenum, metal molybdenum alloy, metal aluminum, or metal aluminum alloy. In order to prevent an interference between adjacent photosensitive and light-emitting layers, an insulated sidewall (may also be referred to as a spacer) can be disposed at a side wall of the light-shielding structure 112. The material of the insulated sidewall includes, for example, silicon nitride or silicon dioxide.

The proportion of In component of the infrared photosensitive and emitting layer 111d may be greater than the proportion of In component of the red-light photosensitive and emitting layer 111a, the proportion of In component of the red-light photosensitive and emitting layer 111a may be greater than the proportion of In component of the green-light photosensitive and emitting layer 111b, the proportion of In component of the green-light photosensitive and emitting layer 111b may be greater than the proportion of the In component of the blue-light photosensitive and emitting layer 111c.

In the red-light photosensitive and emitting layer 111a, the proportion range of In component may be from 0.4 to 0.6, the range of the wavelength for the light required to generate the photosensitive current may be from 400 nm to 720 nm, and the wavelength range for the emitting light may also be from 400 nm to 720 nm.

In the green-light photosensitive and emitting layer 111b, the proportion range of In component may be from 0.2 to 0.3, the range of the wavelength for the light required to generate the photosensitive current may be from 400 nm to 600 nm, and the wavelength range for the emitting light may also be from 400 nm to 600 nm.

In the blue-light photosensitive and emitting layer 111c, the proportion range of In component may be from 0.01 to 0.1, the range of the wavelength for the light required to generate the photosensitive current may be from 400 nm to 500 nm, and the wavelength range for the emitting light may also be from 400 nm to 500 nm.

In the infrared photosensitive and emitting layer 111d, the proportion range of In component may be from 0.7 to 0.9, the range of the wavelength for the light required to generate the photosensitive current may be from 800 nm to 950 nm, and the wavelength range for the emitting light may also be from 800 nm to 950 nm.

It should be noted that the proportion of In component in the red-light photosensitive and emitting layer 111a refers to the percentage of the amount of substance of In element to the sum of the amounts of substance of all positively charged elements in the red-light photosensitive and emitting layer 111a. For example, if the material of the red-light photosensitive and emitting layer 111a is InGaN, the proportion of In component refers to the percentage for the amount of substance for In element to the sum of the amount of substance for In and Ga; and if the material of the red-light photosensitive and emitting layer 111a is InAlGaN, the proportion of In component refers to the percentage of the amount of substance for In to the sum of the amounts of substance for In, Al and Ga.

The proportion of In component in the green-light photosensitive and emitting layer 111b refers to the percentage of the amount of substance for In element to the sum of the amounts of substance for all elements with positive charge in the green-light photosensitive and emitting layer 11b.

The proportion of In component in the blue-light photosensitive and emitting layer 111c refers to the percentage of the amount of substance for In element to the sum of the amounts of substance for all elements with positive charge in the blue-light photosensitive and emitting layer 111c.

The proportion of In component in the infrared photosensitive and emitting layer 111d refers to the percentage of the amount of substance for In element to the sum of the amounts of substance for all elements with positively charged in the infrared photosensitive and emitting layer 111d.

In addition, in this embodiment, each numeric range includes the end-point value.

In this way, for the GaN-based LED structure 111, if the driving voltage is less than or equal to the first threshold value, the infrared photosensitive and emitting layer 111d emits the infrared light.

If the driving voltage is greater than the first threshold value but less than or equal to the second threshold value, the red-light photosensitive and emitting layer 111a emits the red light.

If the driving voltage is greater than the second threshold value but less than or equal to the third threshold value, the green-light photosensitive and emitting layer 111b emits the green light.

If the driving voltage is greater than the third threshold value but less than or equal to the fourth threshold value, the blue-light photosensitive and emitting layer 111c emits the blue light.

The first threshold value is smaller than the second threshold value, the second threshold value is smaller than the third threshold value, and the third threshold value is smaller than the fourth threshold value.

Therefore, although the structure of each GaN-based LED structure 111 is the same, the colors of the light emitted by the GaN-based LED structures 111 can still be adjusted by the value of the driving voltage.

For each GaN-based LED structure 111, if illuminated by the blue-light, the red-light photosensitive and emitting layer 111*a*, the green-light photosensitive and emitting layer 111*b*, the blue-light photosensitive and emitting layer 111*c* and the infrared photosensitive and emitting layer 111*d* may all generate the photosensitive electrical signals. If illuminated by the green-light, the red-light photosensitive and emitting layer 111*a*, the green-light photosensitive and emitting layer 111*b* and the infrared photosensitive and emitting layer 111*d* may generate the photosensitive electrical signals. If illuminated by the red-light, the red-light photosensitive and emitting layer 111*a* and the infrared photosensitive and emitting layer 111*d* may generate the photosensitive electrical signals. If illuminated by the infrared-light, only the infrared-light photosensitive and emitting layer 111*d* may generate the photosensitive electrical signal. In other words, for one GaN-based LED structure 111, the photosensitive electrical signal intensity generated by the illumination of the blue-light is greater than the photosensitive electrical signal intensity generated by the illumination of the green-light, the photosensitive electrical signal intensity generated by the illumination of the green-light is greater than the photosensitive electrical signal intensity generated by the illumination of the red-light, and the photosensitive electrical signal intensity generated by the illumination of the red-light is greater than the photosensitive electrical signal intensity generated by the illumination of the infrared light. Therefore, although the structure of each GaN-based LED structure 111 is the same, the colors and the brightness of the illuminated light can still be distinguished by the photosensitive electrical signal intensity.

In this embodiment, as shown in FIG. 2, the base 10 has multiple charge storage regions 101. The charge storage region 101 may be a floating diffusion (FD) region. For example, an n-type lightly doped region formed in a p-type well may be used as a floating diffusion region.

Each GaN-based LED structure 111 is electrically connected to a charge storage region 101 for storing the generated photosensitive charges.

In this embodiment, multiple transistors 102 are provided on the base 10, and the source region or the drain region of at least one transistor 102 is the charge storage region 101. A metal interconnect layer 14 is between the base 10 and the GaN-based LED structure 111, and the metal interconnect structures 141 of the metal interconnect layer 14 are electrically connected to the multiple transistors 102.

Some of the transistors 102 are provided with the photosensitive-processing circuit 13, the photosensitive-processing circuit 13 detects the photosensitive electrical signal generated by the GaN-based LED structure 111. If a detected photosensitive electrical signal intensity is greater than a fifth threshold value, a blue-light incident signal is stored.

If the photoelectric electrical signal intensity detected by the photosensitive-processing circuit 13 from the GaN-based LED structure 111 is greater than a sixth threshold value but less than or equal to the fifth threshold value, a green-light incident signal is stored.

If the photoelectric electrical signal intensity detected by the photosensitive-processing circuit 13 from the GaN-based LED structure 111 is greater than a seventh threshold value but less than or equal to the sixth threshold value, a red-light incident signal is stored.

If the photoelectric electrical signal intensity detected by the photosensitive-processing circuit 13 from the GaN-based LED structure 111 is less than or equal to the seventh threshold value, an infrared-light incident signal is stored.

The fifth threshold value is greater than the sixth threshold value, and the sixth threshold value is greater than the seventh threshold value.

The photosensitive-processing circuit 13 is used to realize that the GaN-based LED structure 111 senses the visible-light in the capturing-visible-light-image state and senses the infrared-light in the infrared-identifying state.

In the first-selected region 1*a*, the number of the GaN-based LED units 11 used for real-time viewing before capturing optionally accounts for more than 40% of the number of all the GaN-based LED units 11 in the first-selected region 1*a*. Further, the GaN-based LED units 11 used for real-time viewing before capturing may be distributed apart.

Additionally, other transistors 102 may include transfer transistors, the reset transistors, source-follower transistors, and row select transistors. The source electrode of the transfer transistor is electrically connected to a GaN-based LED structure 111 through the metal interconnection structure 141, and the drain electrode of the transfer transistor is a floating diffusion region, so the transfer transistor is used to transfer photoelectric charges from a GaN-based LED structure 111 to the floating diffusion region. The source electrode of the reset transistor is the floating diffusion region, and the drain electrode of the reset transistor is electrically connected to the supply voltage line through the metal interconnection structure 141, so that the reset transistor is used to reset the floating diffusion region to the supply voltage VDD. Through the metal interconnect structure 141, the gate electrode of the source-follower transistor is electrically connected to the floating diffusion region, the source electrode of the source-follower transistor is electrically connected to the supply voltage VDD, and the drain electrode of the source-follower transistor is electrically connected to the source electrode of the row select transistor. The gate electrode of the row select transistor is electrically connected to the row scan line through the metal interconnect structure 141 to output the drain voltage of the source-follower transistor in response to an address signal. The above-mentioned source electrodes and drain electrodes may be exchanged according to the direction of current flow.

The drain electrode of the row selection transistor may be connected to the input end of the photosensitive-processing circuit 13.

In addition, as shown in FIG. 2, the metal interconnect layer 14 has a conductive plug 142. The first end of the conductive plug 142 is connected to the GaN-based LED structure 111, and the second end of the conductive plug 142 is electrically connected to the charge storage region 101. Moreover, the first end of the conductive plug 142 is connected to a bottom wall of the GaN-based LED structure 111.

In other embodiments, the first end of the conductive plug 142 may be connected to a sidewall of the GaN-based LED structure 111. Research shows that, in the photosensitive layer of GaN-based materials containing In, the current flowing in the plane is greater than the current flowing in the thickness direction. Therefore, that the conductive plug 142 is connected to the side wall of each GaN-based LED structure 111 can increase the number of the transferred photoelectric charges.

In some embodiments, the side wall of the GaN-based LED structure 111 connected to the first end of the conductive plug 142 is close to the light-shielding structure 112.

Multiple transistors 102 are further provided with an infrared-emitting circuit 15. The input end of the infrared-emitting circuit 15 is used to receive the infrared-emitting signal. The output end of the infrared-emitting circuit 15 is connected to the metal interconnect structures 141. The infrared-emitting signal is transmitted through the metal interconnect structures 141 to the GaN-based LED structure 111.

The infrared-emitting circuit 15 is used to realize that the GaN-based LED structure 111 emits the infrared-light in the infrared-identifying state.

In the second-selected region 1b, the GaN-based LED unit 11 used for emitting the infrared-light and the GaN-based LED unit 11 used for sensing the infrared light are optionally distributed alternately.

The multiple transistors 102 are further provided with a display-drive circuit 16. The input end of the display-drive circuit 16 is used to receive the red display driving signal, the green display driving signal and the blue display driving signal. The output end of the display-drive circuit 16 is connected to the metal interconnect structures 141, the red display driving signal, the green display driving signal and the blue display driving signal are transmitted to GaN-based LED structure 111 through the metal interconnect structures 141.

The display-drive circuit 16 is used to realize that the GaN-based LED structure 111 emits the visible light in the capturing-visible-light-image state and the visible-light identifying state.

In the third-selected region 1c, the number of the GaN-based LED units 11 used for sensing the visible light optionally accounts for more than 40% of the number of all the GaN-based LED units 11 in the third-selected region 1c. Further, the GaN-based LED units 11 used for illuminating and the GaN-based LED units 11 used for sensing the visible light are optionally distributed alternately.

One of the photosensitive-processing circuit 13 and the display-drive circuit 16 is connected to the metal interconnect structures 141 at the same time, which is used to make the first-selected region 1a in the display state or in the capturing-visible-light-image state, or to make the third-selected region 1c in the display state or in the visible-light identifying state.

In the display state, when the visible light is emitted, the red display driving signal, the green display driving signal and the blue display driving signal corin response to deter-mining that the same luminous intensity. When the light is mixed to form white light, the mixed light can be used for illumination.

One of the photosensitive-processing circuit 13 and the infrared-emitting circuit 15 is connected to the metal interconnect structures 141 at the same time, which is used to make the second-selected region 1b in the display state or in the infrared-identifying state.

In the display panel 1 of this embodiment, the first-selected region 1a, the second-selected region 1b and the third-selected region 1c may be complementary. In the display state, all the first GaN-based LED structure 111 in all regions of the display panel 1 can collaboratively display a visible light image.

The display panel 1, according to the software control program, can simultaneously collect the visible light images in the first-selected region 1a, perform the infrared identification in the second-selected region 1b, and perform the identification for the visible-light in the third-selected region 1c to deliver a better user experience.

In other embodiments, in addition to the first-selected region 1a, the second-selected region 1b and the third-selected region 1c, any two of which are staggered, other regions of the display panel 1 may further have GaN-based LED units 11 which are disposed in an array, each GaN-based LED unit 11 includes multiple GaN-based LED structures 111. In the display state, all the GaN-based LED structures 111 in all regions of the display panel 1 can collaboratively display a visible light image.

A lens structure 12 is provided at a side of the GaN-based LED unit 11 away from the substrate 10. The lens structure 12 includes multiple lenses, and one lens is disposed above each GaN-based LED structure 111.

In this embodiment, the GaN-based LED unit 11 is located above the base 10 instead of being spread flat on the surface of base 10. Therefore, a large design space can be provided for the charge storage region 101 and the storage capacitor, thereby obtaining a greater full well capacity, bringing an improvement in high dynamic range and naturally having the design conditions for a global shutter.

Figure 3:
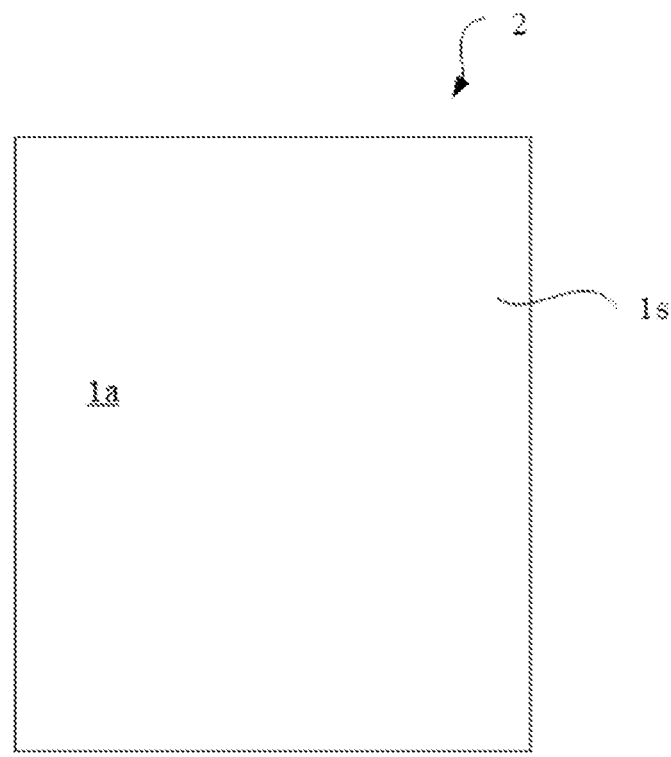
FIG. 3 is a schematic cross-sectional structure diagram of a display panel according to a second embodiment of the present disclosure.

FIG. 3 is a schematic cross-sectional structure diagram of a display panel according to a second embodiment of the present disclosure.

Referring to FIGS. 3 and 1, the display panel 2 in the second embodiment is roughly the same as the display panel 1 in the first embodiment, the only difference is that the first-selected region 1a is the display region 1s.

In other words, all the display region 1s is used to collect the visible-light-image. The larger area for collecting the image allows for wider angle shooting and higher pixel.

Whether to use all the display region is to collect the visible light images can be realized by providing users with optional options through a software to deliver more user experience.

Figure 4:
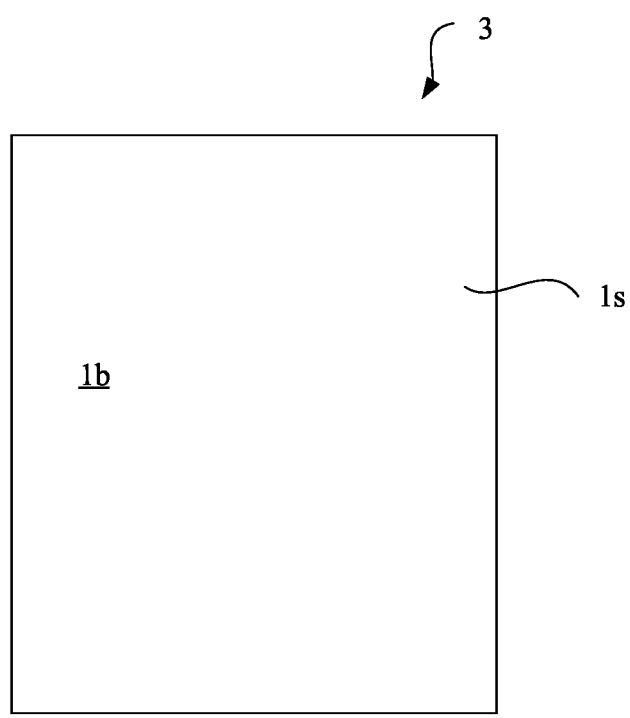
FIG. 4 is a schematic cross-sectional structure diagram of a display panel according to a third embodiment of the present disclosure.

FIG. 4 is a schematic of the cross-sectional structure diagram of a display panel according to a third embodiment of the present disclosure.

Referring to FIGS. 4, 1 and 3, the display panel 3 in the second embodiment is roughly the same as the display panel 1 in the first embodiment, the display panel 2 in the second embodiment, the only difference is that the second-selected region 1b is the display region 1s.

In other words, all the display region 1s is used for the infrared identification. The larger area for the infrared identification allows for more refined identification information, thereby leading to a more accurate identification rate.

Whether to use all the display region is to perform the infrared identification can be realized by providing users with optional options through a software to deliver more user experience.

Figure 5:
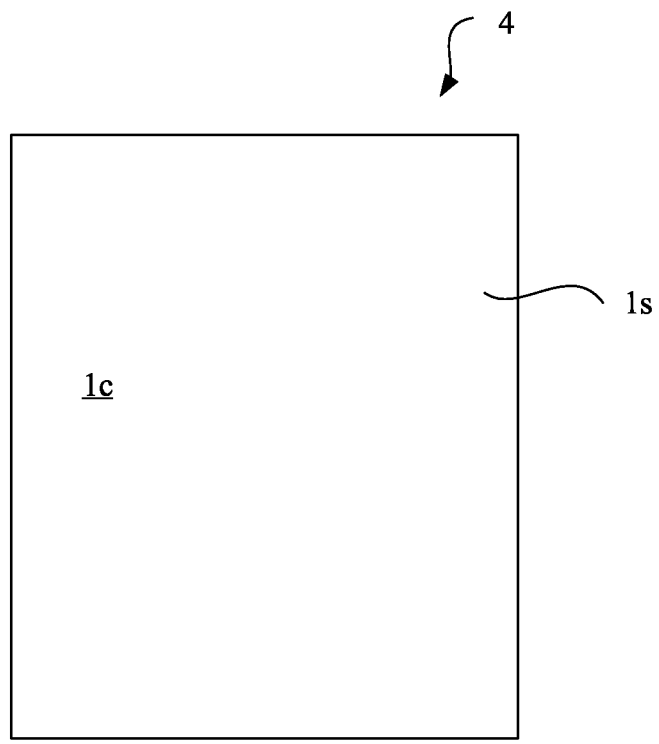
FIG. 5 is a schematic cross-sectional structure diagram of a display panel according to a fourth embodiment of the present disclosure.

FIG. 5 is a schematic of the cross-sectional structure diagram of a display panel according to a fourth embodiment of the present disclosure.

Referring to FIGS. 5, 4, 1 and 3, the display panel 4 in the fourth embodiment is roughly the same as the display panel 1 in the first embodiment, the display panel 2 in the second embodiment, the display panel 3 in the third embodiment, the only difference is that the third-selected region 1c is the display region 1s.

In other words, all the display region 1s is used for the visible-light identification. The larger area for the identification of the visible-light allows for more refined identification information, thereby leading to a more accurate identification rate.

Whether to use all the display region is to perform the visible-light identification can be realized by providing users with optional options through a software to deliver more user experience.

Figure 6:
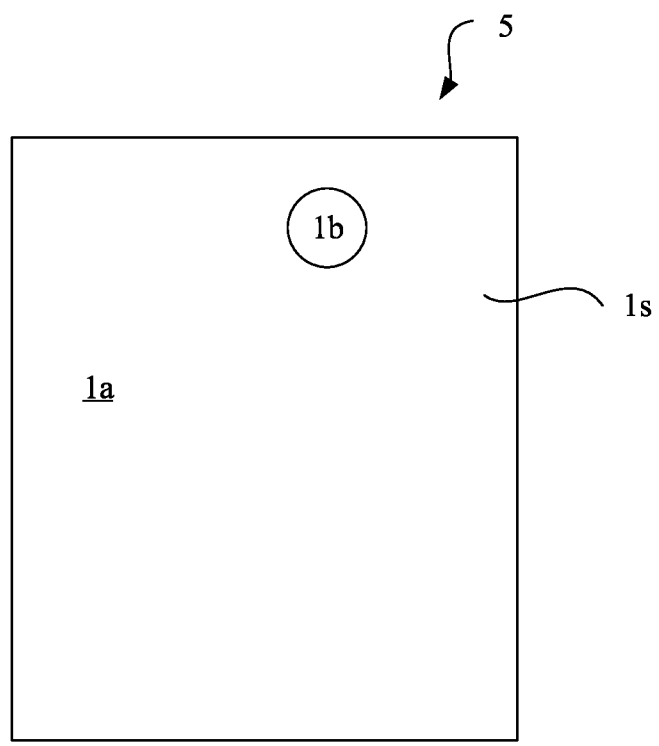
FIG. 6 is a schematic cross-sectional structure diagram of a display panel according to a fifth embodiment of the present disclosure.

FIG. 6 is a schematic diagram of the cross-sectional structure of a display panel according to a fifth embodiment of the present disclosure.

Referring to FIGS. 6, 5, 4, 1 and 3, the display panel 5 in the fifth embodiment is roughly the same as the display panel 1 in the first embodiment, the display panel 2 in the second embodiment, the display panel 3 in the third embodiment, the display panel 4 in the fourth embodiment, the only difference is that the first-selected region 1a and the second-selected region 1b are complementary.

In other embodiments, in addition to the first-selected region 1a and the second-selected region 1b which are staggered, other regions of the display panel 5 may further have GaN-based LED units 11 which are disposed in an array, each GaN-based LED unit 11 includes multiple GaN-based LED structures 111. In the display state, all the GaN-based LED structures 111 in all regions of the display panel 5 can collaboratively display a visible light image.

In other words, the display panel 5, according to the software control program, can simultaneously collect the visible light images in the first-selected region 1a, and perform the infrared identification in the second-selected region 1b.

Whether to collect the visible light images at the first-selected region 1a and perform the infrared identification at the second-selected region 1b at the same time can be realized by providing users with optional options through the software to deliver more user experience.

Figure 7:
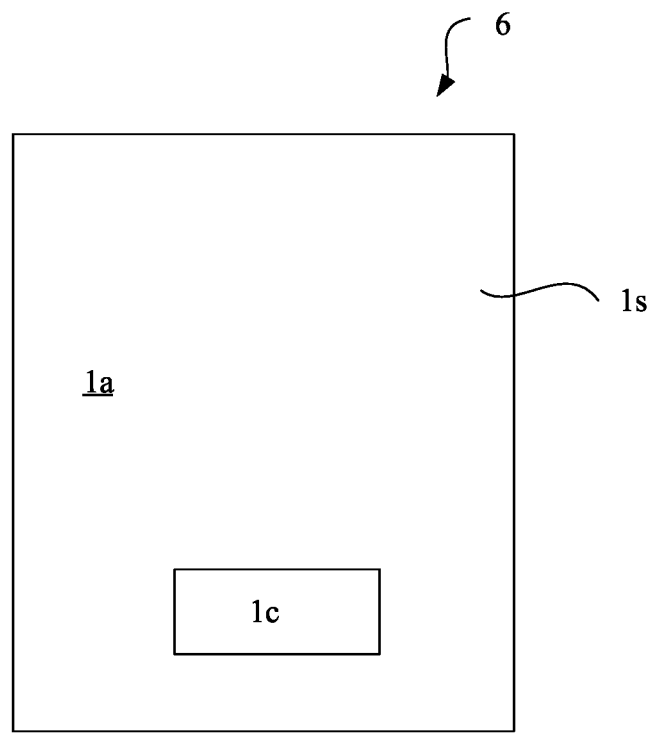
FIG. 7 is a schematic cross-sectional structure diagram of a display panel according to a sixth embodiment of the present disclosure.

FIG. 7 is a schematic of the cross-sectional structure diagram of a display panel according to a sixth embodiment of the present disclosure.

Referring to FIGS. 7, 6, 5, 4, 1 and 3, the display panel 6 in the sixth embodiment is roughly the same as the display panel 1 in the first embodiment, the display panel 2 in the second embodiment, the display panel 3 in the third embodiment, the display panel 4 in the fourth embodiment, the display panel 5 in the fifth embodiment, the only difference is that in the display region 1s, the first-selected region 1a and the third-selected region 1c are complementary.

In other embodiments, in addition to the first-selected region 1a and the second-selected region 1c which are staggered, other regions of the display panel 6 may further have GaN-based LED units 11 which are disposed in an array, each GaN-based LED unit 11 includes multiple GaN-based LED structures 111. In the display state, all the GaN-based LED structure 111 in all regions of the display panel 6 can collaboratively display a visible light image.

In other words, the display panel 6, according to the software control program, can simultaneously collect the visible light images in the first-selected region 1a, and perform the identification for the visible light in the third-selected region 1c.

Whether to collect the visible light images at the first-selected region 1a and perform visible-light identification at the third-selected region 1c at the same time can be realized by providing users with optional options through the software to deliver more user experience.

Figure 8:
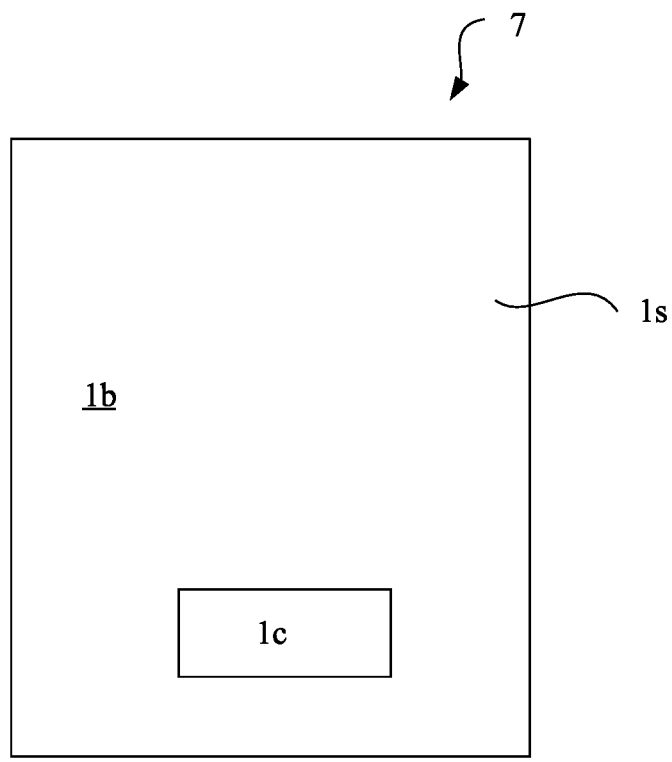
FIG. 8 is a schematic cross-sectional structure diagram of a display panel according to a seventh embodiment of the present disclosure.

FIG. 8 is a schematic cross-sectional structure diagram of a display panel according to a seventh embodiment of the present disclosure.

Referring to FIGS. 8, 7, 6, 5, 4, 1 and 3, the display panel 7 in the seventh embodiment is roughly the same as the display panel 1 in the first embodiment, the display panel 2 in the second embodiment, the display panel 3 in the third embodiment, the display panel 4 in the fourth embodiment, the display panel 5 in the fifth embodiment, the display panel 6 in the sixth embodiment, the only difference is that in the display region 1s, the second-selected region 1b and the third-selected region 1c are complementary.

In other embodiments, in addition to the second-selected region 1b and the third-selected region 1c which are staggered, other regions of the display panel 7 may have GaN-based LED units 11 which are disposed in an array, each GaN-based LED unit 11 includes multiple GaN-based LED structures 111. In the display state, all the GaN-based LED structures 111 in all regions of the display panel 7 can collaboratively display a visible light image.

In other words, the display panel 7, according to the software control program, can simultaneously perform the infrared identification in the second-selected region 1b and perform the identification for the visible light in the third-selected region 1c.

Whether to perform the infrared identification at the second-selected region 1b and perform the visible-light identification at the third-selected region 1c at the same time can be realized by providing a user with an optional option through a software to deliver more user experience.

Compared with the prior art, the present disclosure has the following beneficial effects.

1) By using an LED unit which is made of GaN-based materials as a pixel unit, the pixel unit can not only emit visible light, but also sense visible light. Therefore, after the user selects a region, some GaN-based LED units in the selected region can be used for real-time viewing before capturing; then in the capturing-image state, all of the GaN-based LED units in the selected region can be used for capturing an image. A larger area of a captured image brings a wider angle of shooting and higher pixels, and forming a slot in the display panel to install a camera can be avoid, thereby avoiding occupying a display region, and achieving a full screen.

2) In the optional embodiments, a display region includes a second-selected region, the second-selected region includes an infrared-identifying state, in the infrared-identifying state, some GaN-based LED units in the second-selected region are used for emitting the infrared light, and the remaining GaN-based LED units in the second-selected region are used for sensing the infrared light. The LED units are manufactured by using GaN-based materials, the GaN-based LED units can not only emit visible light and sense visible light, but also emit infrared light and sense infrared-light for infrared identification. In this way, forming a slot in the display panel to install an infrared identification device can be avoid, thereby avoiding occupying a display region, and achieving a full screen.

The infrared identification is, for example, but not limited to, used for three-dimensional scene (such as face) identification containing a depth information.

3) In the optional embodiments, a display region includes a third-selected region, the third-selected region includes a visible-light-identifying state, in the visible-light-identifying state, some GaN-based LED units are used for illuminating, and the remaining GaN-based LED units are used for sensing visible light. Forming a slot in the display panel to install a visible-light identification device can be avoid, thereby avoiding occupying a display region, and achieving a full screen.

The visible-light identification is, for example, but not limited to, fingerprint identification.

Although the present disclosure is disclosed as above, the present disclosure is not limited thereto. Any person skilled in the art may make various changes and modifications without departing from the spirit and scope of the present disclosure, and therefore the scope of protection of the present disclosure shall be subject to the scope defined by the claims.

The invention claimed is:

1. A display panel, comprising: a display region, wherein the display region comprises GaN-based LED units arranged in an array, the display region comprises a first-selected region, the first-selected region comprises a capturing-visible-light-image state comprising a state of real-time viewing before capturing and a capturing-image state; at the state of real-time viewing before capturing, some GaN-based LED units in the first-selected region are used for real-time viewing before capturing, and at the capturing-image state, all of the GaN-based LED units in the first-selected region are used for capturing an image;

wherein each of the GaN-based LED units comprises GaN-based LED structures used for sensing light and emitting light;

wherein each of the GaN-based LED structures comprises a red-light photosensitive and emitting layer, a green-light photosensitive and emitting layer, a blue-light photosensitive and emitting layer and an infrared photosensitive and emitting layer which are stacked from up and down; materials of the red-light photosensitive and emitting layer, the green-light photosensitive and emitting layer, the blue-light photosensitive and emitting layer and the infrared photosensitive and emitting layer are GaN-based materials containing different proportions of In; when the red-light photosensitive and emitting layer, the green-light photosensitive and emitting layer, the blue-light photosensitive and emitting layer and the infrared photosensitive and emitting layer are used for sensing light, photosensitive charges are generated based on wavelengths of received light, or not generated based on wavelengths of received light; and when the red-light photosensitive and emitting layer, the green-light photosensitive and emitting layer, the blue-light photosensitive and emitting layer and the infrared photosensitive and emitting layer are used for emitting light, light with different wavelengths and different strengths is generated based on different values of applied voltages.

2. The display panel according to claim 1, wherein, the first-selected region is the display region.

3. The display panel according to claim 1, wherein, the display region comprises a second-selected region, the second-selected region comprises an infrared-identifying state, at the infrared-identifying state, some GaN-based LED units in the second-selected region are used for emitting infrared light, and the remaining GaN-based LED units in the second-selected region are used for sensing infrared light.

4. The display panel according to claim 3, wherein, the second-selected region is the display region.

5. The display panel according to claim 1, wherein, the display region comprises a third-selected region, the third-selected region comprises a visible-light-identifying state, at the visible-light-identifying state, some GaN-based LED units are used for illuminating, and the remaining GaN-based LED units are used for sensing visible light.

6. The display panel according to claim 5, wherein, the third-selected region is the display region.

7. The display panel according to claim 1, wherein, the display region comprises a display state, and at the display state, the GaN-based LED units in the display region are used for displaying a visible light image.

8. The display panel according to claim 1, wherein,
a proportion range of In component in the red-light photosensitive and emitting layer is from 0.4 to 0.6;
a proportion range of In component in the green-light sensitive and emitting layer is from 0.2 to 0.3;
a proportion range of In component in the blue-light sensitive and emitting layer is from 0.01 to 0.1; and
a proportion range of In component in the infrared sensitive and emitting layer is from 0.7 to 0.9.

9. The display panel according to claim 1, wherein, the display panel comprises a base having charge storage regions; and each of the GaN-based LED structures is electrically connected to one of the charge storage regions to store generated photosensitive charges.

10. The display panel according to claim 9, wherein, the base is provided with transistors, a source region or a drain region of at least one of the transistors is one of the charge storage regions, a metal interconnect layer is between the base and the GaN-based LED units, and a metal interconnect structure of the metal interconnect layer is electrically connected to the transistors.

11. The display panel according to claim 10, wherein, the transistors are provided with a photosensitive-processing circuit, and the photosensitive-processing circuit is configured to detect a photosensitive electrical signal generated by the GaN-based LED structures;

in response to determining that a photosensitive electrical signal intensity detected by the photosensitive-processing circuit from the GaN-based LED structures is greater than a fifth threshold value, a blue-light incident signal is stored;

in response to determining that a photosensitive electrical signal intensity detected by the photosensitive-processing circuit from the GaN-based LED structures is greater than a sixth threshold value and less than or equal to the fifth threshold value, a green-light incident signal is stored;

in response to determining that a photosensitive electrical signal intensity detected by the photosensitive-processing circuit from the GaN-based LED structures is greater than a seventh threshold value and less than or equal to the sixth threshold value, a red-light incident signal is stored; and in response to determining that a photosensitive electrical signal intensity detected by the photosensitive-processing circuit from the GaN-based LED structures is less than or equal to the seventh threshold value, an infrared-light incident signal is stored.

12. The display panel according to claim 10, wherein, the metal interconnect layer has a conductive plug, a first end of the conductive plug is connected to one of the GaN-based LED structures, and a second end of the conductive plug is electrically connected to one of the charge storage regions.

13. The display panel according to claim 11, wherein, the transistors are further provided with an infrared-emitting circuit, an input end of the infrared-emitting circuit is used to receive infrared-emitting signals, an output end of the infrared-emitting circuit is connected to the metal interconnect structures, and the infrared-emitting signals are transmitted to the GaN-based LED structures through the metal interconnect structures.

14. The display panel according to claim 13, wherein, the transistors are further provided with a display-drive circuit, an input end of the display-drive circuit is used to receive a red display driving signal, a green display driving signal and a blue display driving signal, an output end of the display-drive circuit is connected to the metal interconnect structures, and the red display driving signal, the green display driving signal and the blue display driving signal are transmitted to the GaN-based LED structures through the metal interconnect structures.

15. The display panel according to claim 14, wherein, one of the display-drive circuit and the photosensitive-processing circuit is connected to the metal interconnect structures at the same time, one of the photosensitive-processing circuit and the infrared-emitting circuit is connected to the metal interconnect structures at the same time.

16. The display panel according to claim 3, wherein, the display region comprises the first-selected region and the second-selected region which are staggered with each other completely.

17. The display panel according to claim 5, wherein, the display region comprises the first-selected region and the third-selected region which are staggered with each other completely.

* * * * *